April 19, 1966 W. F. MITTENDORF 3,247,314

COMPOSITE ELECTRIC CIRCUIT

Filed Dec. 31, 1962

INVENTOR.
WILLIAM F. MITTENDORF
BY John K. Conant
ATTORNEY

United States Patent Office 3,247,314
Patented Apr. 19, 1966

3,247,314
COMPOSITE ELECTRIC CIRCUIT

William F. Mittendorf, Medfield, Mass., assignor to Engelhard Industries, Inc., Newark, N.J., a corporation of Delaware Filed Dec. 31, 1962, Ser. No. 248,397
4 Claims. (Cl. 174—68.5)

The present invention relates to an improved composite electric circuit, in the nature of a printed circuit, on an insulating baseboard.

Composite electric circuits, which are usually referred to as printed circuits, are electrically conductive paths laid out on and fixed to an insulating baseboard in a predetermined pattern. They are formed in various ways. One way is to paint or print a solution of graphite or metal powder on the insulating base in the desired pattern and dry or sinter the powder. Another way is to bond conductive metal foil to an insulating base and print the circuit pattern on the foil with an acid-resistant ink. Acid is then applied to etch away the unprotected portions of the foil and leave a foil circuit pattern.

It has, however, been difficult using methods known in the art to provide an effective printed-type circuit in which the conductor has a sufficiently large cross section uniformly over its length to carry a current load without burning out.

Circuits formed by conventional methods of printing, painting, or etching are apt to have cracks, omissions, pin holes, or thin spots which render the circuit inoperable or which cause the circuit to break down prematurely. Moreover, printed type circuits made in accordance with present practices tend to be fragile and it is difficult to solder, braze, or weld connections to them without breaking the conductor.

It is a principal object of the present invention to provide a printed-type circuit in which the conductor has a minimum uniform cross section of predetermined size.

A further object is to provide a printed-type circuit to which connections and electric components may be welded, soldered, or brazed more easily than to previous printed-type circuits and without weakening or breaking the conductor.

In accordance with the present invention, a metal wire conductor is laid out in a predetermined circuit pattern on an insulating baseboard of glass, resin impregnated fiberglass, or other dielectric material and tacked temporarily to the base with an adhesive or by mechanical means such as with staples.

A film of an electrically conductive metal is then deposited on and adheres to the conductor and adjacent portions of the baseboard. This attaches the wire conductor to the baseboard, increases the cross sectional area of the conductor (and hence increases its current carrying capacity) and provides a good surface to which to attach transistors, capacitors, resistors and other electrical components.

The film of electrically conductive metal is formed by painting on the wire conductor and adjacent portions of the baseboard a solution of a thermally decomposable salt of an electrically conductive metal dissolved in a liquid organic vehicle. After the volatile solvents have evaporated from the solution, heat is applied to decompose the salt and leave a film of metal on the conductor and adjacent portions of the baseboard.

Compositions used for decorating glassware or ceramics with platinum, gold or silver and applied by conventional methods used in the decorating art are particularly suitable for forming the film of electrically conductive metal in accordance with this invention.

Further objects and advantages of the circuit of the present invention will be apparent from the following more detailed description accompanying drawings in which.

Figure 1:
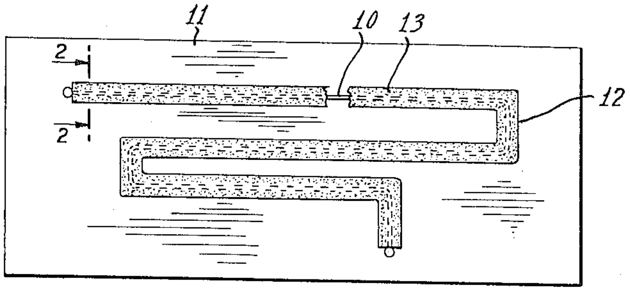
FIGURE 1 is a top-plan view of a composite circuit in accordance with the present invention.

Referring now to the drawings, a wire conductor 10 is laid out in a predetermined pattern on a dielectric baseboard 11. The conductor 10 is a wire of platinum, silver, aluminum, copper or other electrically conductive metal. The dielectric baseboard 11 may be resin impregnated fiberglass but any dielectric material such as glass or porcelain capable of being formed into a baseboard will be equally suitable.

The conductor 10 may be temporarily tacked to the baseboard 11 with an adhesive or by stapling. Any suitable adhesive which will hold the conductor in place at least temporarily would be satisfactory.

Next, a solution of a thermally decomposable salt of an electrically conductive metal in a liquid organic vehicle is painted on the conductor 10. An excess of the solution is painted on so that some of the solution flows down over the conductor 10 and onto the baseboard adjacent the conductor as indicated at 12 on either side of the conductor 10 in FIGURE 1.

Figure 2:
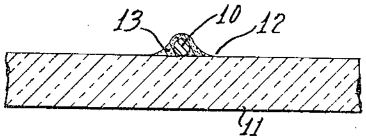
FIGURE 2 is a section along the lines 2—2 of FIGURE 1.
Figure 3:
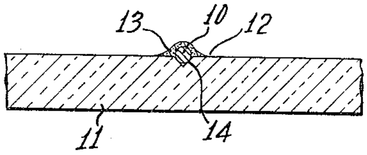
FIGURE 3 is a cross section through the base and conductor showing another embodiment of the present invention.

FIGURE 3 illustrates a modification of the invention in which a groove 14 is made in the baseboard 11 in the pattern of the desired circuit. The wire conductor 10 is laid in the groove of 14 and attached therein by adhesive or mechanical means as described above. Then, a film of electrically conductive metal is formed over the wire conductor 10 and adjacent portions 12 of the baseboard as in the embodiment of the invention illustrated in FIGURES 1 and 2 and as described in detail below.

In both illustrated embodiments of the invention an amount of solution is used which when decomposed will leave deposited on and along the conductor 10 a continuous film of metal in the form of mound 13.

As previously mentioned, the mound 13 may be formed by using decorating compositions which are used for depositing metals such as platinum and gold on plastics, glass and ceramics. Compositions described in U.S. Patent Nos. 3,022,177 and 2,984,575 to Howard M. Fitch are particularly suitable for the present purpose since they may be loaded with a higher concentration of metal and still have suitable viscosity for painting than some of the other decorating compositions known in the art.

A solution from the Fitch Patent No. 3,022,177 which is particularly suitable for the deposition of a mound 13 of conductive metal is a chloroplatinous n-octyl-mercaptide-ethyl sulfide complex dissolved in a vehicle composed of a mixture of two or more of the following ingredients: methyl ethyl ketone; cyclohexanone; ethyl acetate; amyl acetate; Cellosolve solvent; Butanol solvent; nitrobenzene; toluene; xylene; petroleum ether; chloroform; carbon tetrachloride; various terpenes such as pinene, dipentene, dipentene oxide, and the like; essential oils, such as oils of lavender, rosemary, aniseed, sassafras, wintergreen, fennel and turpentine; Assyrian asphalt; various rosins and balsams; and synthetic resins.

After the above solution is painted on, the volatile solvents are allowed to evaporate in air. Then the composition is decomposed to deposit platinum by heating to a minimum of 175° C. for 10 to 20 minutes.

Other suitable compositions are described in the Fitch Patent No. 2,984,575. These compositions may be used if it is desired to deposit a film of gold over the conductor 10 and adjacent portions 12 of the baseboard. One example of a suitable composition from this patent is gold tertiary alkyl mercaptide mixed into a mixture of turpentine and toluene to form a liquid of brushable viscosity. This liquid is brushed on and the volatile solvents allowed to evaporate. The composition is then decomposed to deposit gold by heating to 160° C. or above for a few minutes.

In the deposition of conductive metal to provide a mound 13 as described above the metal adheres to the conductor 10 and to the baseboard 11 and thus also secures the conductor 10 to the baseboard.

In the circuit formed in accordance with the present invention, the wire conductor 10 assures a basic minimum carrying capacity. The added mound 13 of conductive metal increases the current carrying capacity of the circuit and provides an enlarged surface to which electrical components, such as transistors, capacitors, resistors, and diodes, may be securely attached by soldering, welding or brazing.

It will be appreciated that the above description is of a preferred embodiment of the invention and that certain modifications may be made without departing from the scope of the invention defined by the following claims.

What is claimed is:

1. A composite electric circuit comprising a dielectric baseboard, a wire of electrically conductive metal arranged on the baseboard in a predetermined pattern, a film of electrically conductive metal deposited on and adhering to the wire and adjacent portions of the baseboard, said wire being secured to the baseboard essentially by means of said film.

2. A composite electric circuit as set forth in claim 1 in which said wire is in a groove in said baseboard.

3. A composite electric circuit as set forth in claim 1 in which said film is a film of platinum.

4. A composite electric circuit as set forth in claim 1 in which said film is a film of gold.

References Cited by the Examiner

UNITED STATES PATENTS

| | | | |
|---|---|---|---|
| 2,939,812 | 6/1960 | Charlotte | 156—89 |
| 3,006,794 | 10/1960 | Sheldon | 156—89 |
| 3,019,283 | 1/1962 | Little | 174—68.5 |
| 3,042,741 | 7/1962 | Cumpston | 174—68.5 |
| 3,130,257 | 4/1964 | Rott | 174—68.5 |

JOHN F. BURNS, *Primary Examiner.*

DARRELL L. CLAY, *Examiner.*